(12) United States Patent
Bazes

(10) Patent No.: US 7,598,777 B1
(45) Date of Patent: Oct. 6, 2009

(54) HIGH-SPEED REDUCED-OUTPUT-SWING SELF-BIASED FULLY-COMPLEMENTARY CMOS COMPARATOR WITH RAIL-TO-RAIL INPUT COMMON-MODE RANGE

(75) Inventor: Mel Bazes, Haifa (IL)

(73) Assignee: Marvell Israel (M.I.S.L.) Ltd., Yokneam (IL)

( * ) Notice: Subject to any disclaimer, the term of this patent is extended or adjusted under 35 U.S.C. 154(b) by 42 days.

(21) Appl. No.: 11/726,171

(22) Filed: Mar. 20, 2007

Related U.S. Application Data

(60) Provisional application No. 60/815,331, filed on Jun. 21, 2006, provisional application No. 60/814,784, filed on Jun. 19, 2006.

(51) Int. Cl.
*H03K 5/22* (2006.01)

(52) U.S. Cl. .......................................... 327/63; 327/50

(58) Field of Classification Search .................. 327/50, 327/63, 65, 72, 77
See application file for complete search history.

(56) References Cited

U.S. PATENT DOCUMENTS

| | | | |
|---|---|---|---|
| 4,958,133 A | | 9/1990 | Bazes |
| 5,706,222 A | * | 1/1998 | Bonaccio et al. ............. 708/841 |
| 5,793,230 A | * | 8/1998 | Chu et al. ...................... 327/77 |
| 6,091,300 A | * | 7/2000 | Setty et al. .................... 330/258 |
| 6,597,303 B2 | * | 7/2003 | Cosand ......................... 341/165 |
| 6,605,965 B1 | * | 8/2003 | Fernandez-Texon ......... 327/74 |
| 6,617,921 B2 | * | 9/2003 | Forejt .......................... 330/253 |

OTHER PUBLICATIONS

Bazes, M., "Two Novel Fully Complementary Self-Biased CMOS Differential Amplifiers", IEEE Journal of Solid-State Circuits, vol. 26, No. 2, pp. 165-168, Feb. 1991.

Luo, L., et al., "3 Gb/s AC Coupled Chip-to-Chip Communication Using a Low Swing Pulse Receiver", IEEE Journal of Solid-State Circuits, vol. 41, No. 1, pp. 387-396, Jan. 2006.

* cited by examiner

*Primary Examiner*—Dinh T. Le

(57) ABSTRACT

A CMOS comparator having a high-speed reduced-output-swing is provided. The high-speed reduced-output-swing comparator may have a fully complementary CMOS design, be self-biased, and have a rail-to-rail input common-mode range. The self-biasing scheme yields a robust comparator with a low sensitivity to temperature, processing variations, supply-voltage variations, and common-mode input voltages. The fully-complementary design leads to a physically small device with low power consumption. The rail-to-rail input common-mode range leads to a versatile comparator which may take a wide range of inputs. The high-speed reduced-output-swing allows for a quick output response to changes in the input.

28 Claims, 11 Drawing Sheets

US 7,598,777 B1

HIGH-SPEED REDUCED-OUTPUT-SWING SELF-BIASED FULLY-COMPLEMENTARY CMOS COMPARATOR WITH RAIL-TO-RAIL INPUT COMMON-MODE RANGE

This application claims the benefit of U.S. Provisional Application Nos. 60/814,784, filed Jun. 19, 2006 and 60/815,331 filed Jun. 21, 2006, the disclosures of which are incorporated herein by reference in their entireties.

BACKGROUND OF THE INVENTION

This invention relates to the field of CMOS integrated circuits and, more particularly, to CMOS comparators.

A comparator is a device which is generally used to compare two voltage inputs and switch its output to indicate which of the inputs is larger. Typically comparators include at least two analog voltage inputs, which are compared to each other to determine the appropriate digital output. If the difference between the input voltages is positive then a comparator outputs a high value, and if the difference is negative then a comparator outputs a low value. Because of this behavior, comparators are popular for triggering events in digital logic based on the relative values of analog signals. For example, comparators may be used to initiate or terminate an operation depending on the difference between two particular signals.

Comparators have several performance parameters which determine their usefulness for various functions. Comparator gain is the minimum difference between the two input voltages which is required for the comparator to switch its output. A higher comparator gain corresponds to a more precise comparator. Common-mode voltage range is the range of input voltages over which a comparator functions correctly. Common-mode voltage refers to the average voltage of the input signals. A wider common-mode voltage range indicates a comparator which may interface with a wider range of input voltages. Speed corresponds to how fast a comparator's outputs respond to input-voltage changes. A higher speed indicates a quicker response time. Robustness determines how sensitive a comparator is to environmental (e.g., processing, temperature, supply voltage) variations. A more robust comparator corresponds to a less sensitive comparator. Range of output swing determines the difference between the high output value and the low output value. A larger output swing indicates a greater difference between the voltage levels of high and low outputs.

A comparator with a high output swing is traditionally preferable because it easily interfaces with logic circuits requiring large input swings. For example, the term "rail-to-rail output swing" is commonly used to denote an output swing which goes from ground to the supply voltage. These large output swings may be important to ensure the proper functioning of the subsequent digital logic.

Typically, comparator design seeks to maximize each of these different parameters to create a comparator with all around solid performance. However, in some instances it may be desirable to sacrifice certain parameters for higher performance in others. For example, in some comparator applications a higher speed may be valued over a larger output swing.

It would therefore be desirable to design a comparator with a high-speed reduced-output-swing. It would also be desirable for this high-speed reduced-output swing comparator to have a self-biased configuration, a fully-complementary design, and a rail-to-rail input common-mode range.

SUMMARY OF THE INVENTION

In accordance with the invention, a CMOS comparator having a high-speed reduced-output-swing is provided. The high-speed reduced-output-swing comparator may have a fully complementary CMOS design, be self-biased, and have a rail-to-rail input common-mode range. The self-biasing scheme yields a robust comparator with a low sensitivity to temperature, processing variations, supply-voltage variations, and common-mode input voltages. The fully-complementary design leads to a physically small device with low power consumption. The rail-to-rail input common-mode range leads to a versatile comparator which may take a wide range of inputs. The high-speed reduced-output-swing allows for a quick output response to changes in the input.

Further features of the invention, its nature and various advantages, will be more apparent from the accompanying drawings and the following detailed description of the preferred embodiments.

BRIEF DESCRIPTION OF THE DRAWINGS

The objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
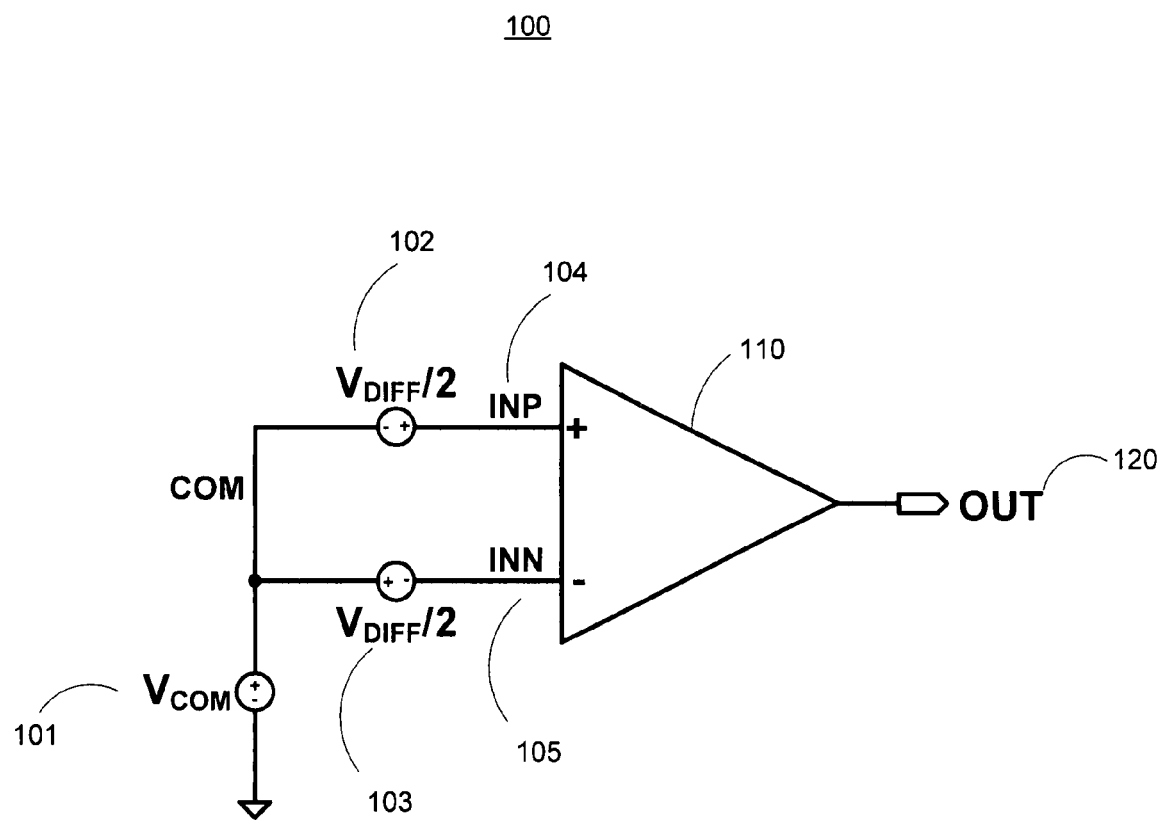
FIG. 1 is a circuit equivalent schematic diagram of a comparator and its input and output connections.

FIG. 1 shows a diagram of positive input (INP) 104, negative input (INN) 105, and output (OUT) 120 of ideal comparator 110. Comparator 110 outputs a logic high if the voltage of INP 104 is greater than the voltage of INN 105, and the comparator 110 outputs a logic low if the voltage of INP 104 is less than the voltage of INN 105.

Input signals 104 and 105 may be broken down into individual voltage sources 101, 102, and 103 in order to define the operating conditions of comparator 110. Common voltage source ($V_{COM}$) 101 represents the voltage level which is present in, or common to, both inputs 104 and 105. $V_{COM}$ 101 may be generally defined as the average of two input voltages INP 104 and INN 105. Two other voltage sources 102 and 103 offset INP 104 and INN 105 from $V_{COM}$ 101. Given that $V_{COM}$ 101 is the average of the two input voltages, INP 104 is $V_{COM}$ 101 offset by some magnitude in the positive direction and INN 105 is $V_{COM}$ 101 offset by the same magnitude in the negative direction. This relationship may be represented as $$V_{INP} = V_{COM} + \frac{V_{DIFF}}{2} \text{ and} \qquad \text{Equation 1}$$

$$V_{INN} = V_{COM} - \frac{V_{DIFF}}{2}. \qquad \text{Equation 2}$$

In the above equations $V_{DIFF}$ is the difference between the two input nodes INP 104 and INN 105 which may be expressed as $$V_{DIFF} = V_{INP} - V_{INN}. \qquad \text{Equation 3}$$

If $V_{DIFF}$ is positive, comparator output 120 will read a logic high. If $V_{DIFF}$ is negative, comparator output 120 will read a logic low.

Given that the comparator in FIG. 1 is ideal, it does not address several of the factors which affect real-world comparator circuits. Due to these factors, there are performance parameters used to evaluate potential comparator designs. For example, comparator gain is a parameter related to the minimum detectable difference between two input voltages 104 and 105. Common-mode voltage range is a measure of the range of common-mode voltages 101 over which a comparator functions correctly. Speed is a parameter defining the time necessary for a comparator to respond to input voltage changes. Robustness measures a comparator's sensitivity to environmental variations (i.e., variations in processing, temperature, and supply voltage). Output range is a parameter which indicates the voltage difference between a comparator's high output and its low output. Comparator circuits are designed with different combinations of performance parameters in order to best suit the requirements of a particular application.

For most applications, a comparator with a high comparator gain, a large common-mode voltage range, high-speed outputs, robust operating capability, and large output swings is desirable. Special circumstances arise where some parameters are a higher priority than others. For example, a higher comparator gain could be more valuable than a large common-mode voltage range in a small signal analog-to-digital converter application where the designer expects a limited range of inputs.

In accordance with the present invention, a larger output swing may be sacrificed in the interest of increased speed.

Figure 2:
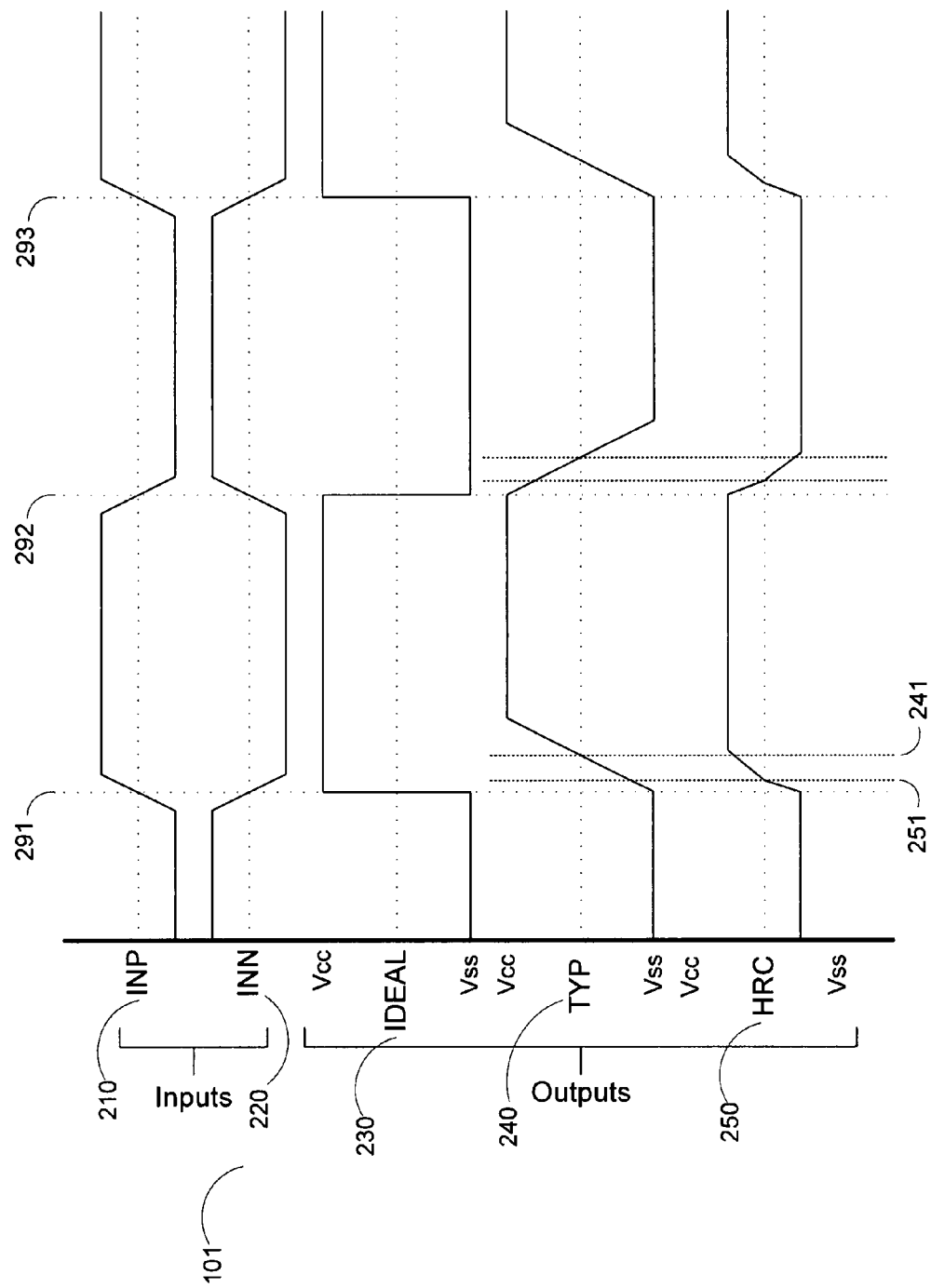
FIG. 2 is a timing diagram comparing the outputs of an ideal comparator, a typical comparator, and a comparator in accordance with one embodiment of the invention.

FIG. 2 is a timing diagram comparing the outputs of an ideal comparator, a typical comparator, and a High-speed Reduced-output-swing Comparator (HRC) in accordance with one embodiment of the invention. Inputs 210 and 220 correspond to positive inputs 210 and negative inputs 220 of all three comparators. Each output is displayed on a scale ranging from supply voltage ($V_{cc}$) to supply return ($V_{ss}$) with a dotted line indicating the common-mode voltage level.

Events 291, 292, and 293 mark times when the relationship between INP 210 and INN 220 changes. For example, INP 210 becomes greater than INN 220 at event 291.

Ideal comparator output 230 could be expected from a theoretical device such as ideal comparator 110. Output 230 shows rail-to-rail output swings as well as instantaneous response times. However, non-ideal comparators are not capable of producing output 230 due to physical limitations, such as transistor switching times.

Typical comparator output 240 provides a rail-to-rail output swing which could be useful when interfacing with digital circuits which require large input swings. One drawback to output 240 is that this signal takes longer to reach the common-mode voltage level when switching states.

High-speed Reduced-output-swing Comparator output 250 exhibits increased switching speed due to reduced output swing when compared to typical output 240. This feature may be seen by analyzing comparator outputs in response to input change events. In response to a change in the inputs, the outputs of the HRC comparator may initially have a higher rate of change than the outputs of a typical comparator. After crossing the common-mode voltage level, the rate of change of the HRC outputs can slow down to less than the slope of typical comparator outputs. In many cases, the most important measurement of the outputs' speed can be the time required for the outputs of the comparator to cross the common-mode voltage level, and the time required for the outputs to reach the final output state might be less important. In this situation, a slower rate of change after crossing the common-mode voltage level might not have a significant impact on the relevant speed measurements.

For example, INP exceeds INN at event 291. Shortly thereafter, HRC output 250 crosses its common-mode voltage level at time 251. Some time later, typical output 240 crosses its common-mode voltage level at time 241. This difference in speed is also present when the outputs transition from a high to a low state, for example in response to event 292. It is contemplated that a complementary differential output could be provided in combination with HRC output 250.

Figure 3:
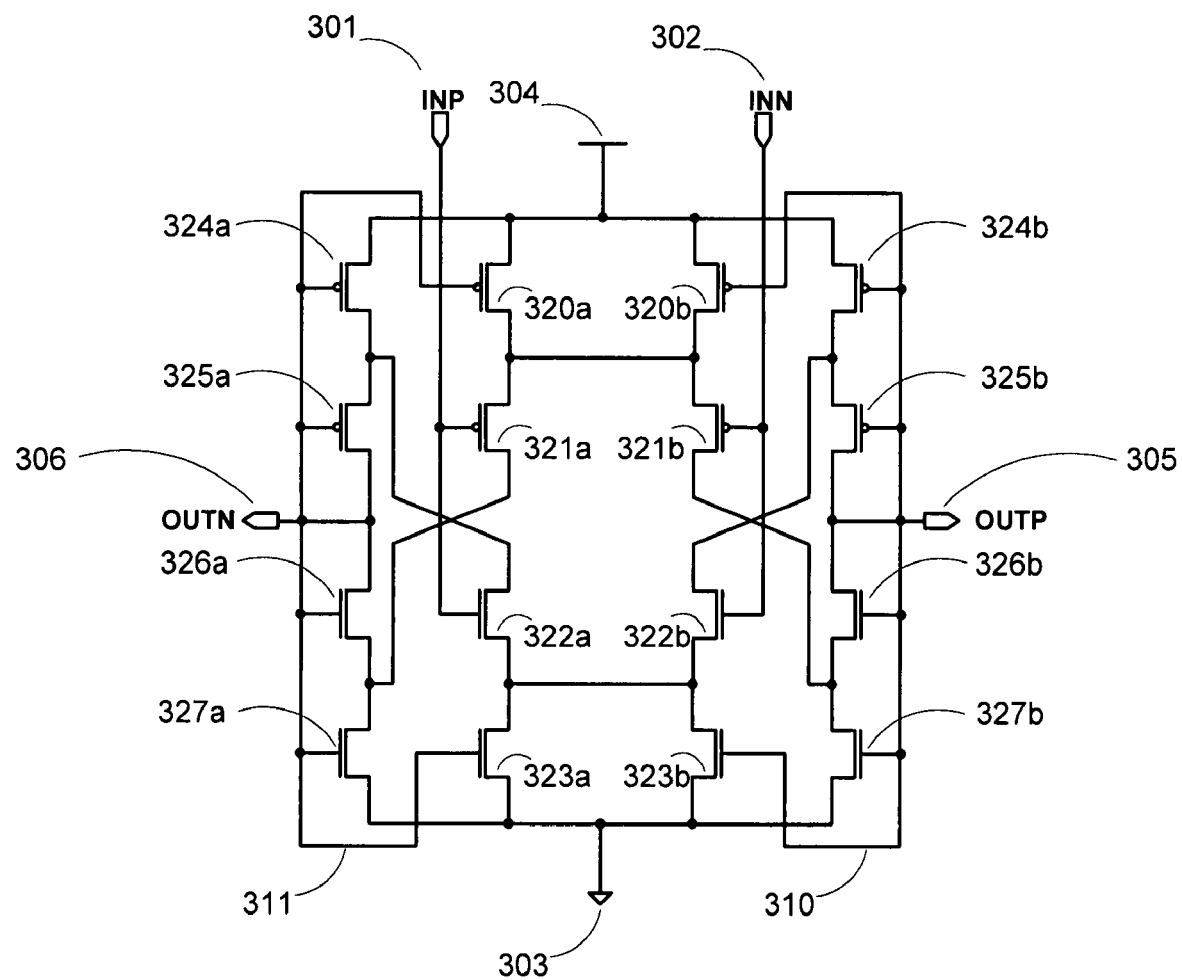
FIG. 3 is a circuit schematic diagram of a comparator in accordance with one embodiment of the invention.

FIG. 3 shows an example of High-speed Reduced-output-swing Comparator (HRC) circuit 300 in accordance with one embodiment of the present invention. This circuit includes two inputs (INP and INN) 301 and 302; supply return ($V_{ss}$) 303; supply voltage ($V_{CC}$) 304; and two outputs (OUTP and OUTN) 305 and 306.

Transistors 320a, 321a, 324a, 325a, 320b, 321b, 324b and 325b may be p-type metal-oxide semiconductor field-effect transistors (MOSFETs). Transistor 322a, 323a, 326a, 327a, 322b, 323b, 326b and 327b may be n-type metal-oxide semiconductor field-effect transistors (MOSFETs).

It is to be noted that comparator 300 is symmetrical and all of the transistors are comprised of matched device pairs. The matched pairs are denoted by having the same reference numeral and are differentiated by the suffix a or b. For example, transistors 321a and 321b comprise one of the matched pairs.

It is to be further noted that comparator 300 is completely complementary since each transistor device has a complementary counterpart of the opposite conduction type. Transistor 320a is complementary to transistor 323a; transistor 321a is complementary to transistor 322a; transistor 324a is complementary to transistor 327a; and transistor 325a is complementary to transistor 326a. Note that these complementary relationships are also true for each transistor's matched pair.

There are several beneficial characteristics of comparator 300. For example, the design of comparator 300 internally incorporates negative feedback into each output. Therefore, unlike some comparator circuits, an external biasing circuit is unnecessary. Negative feedback may be provided for OUTP 305 by coupling output node 310 with the gates of transistors 320*b*, 323*b*, 324*b*, 325*b*, 326*b*, and 327*b*. Therefore any unwanted changes in the voltage of OUTP 305 may be compensated primarily by a change in the behavior of transistors 324*b*, 325*b*, 326*b*, and 327*b* and the behavior of transistors 320*b* and 323*b*, to a lesser extent.

This negative feedback, self-biasing scheme compensates for variations in operating conditions, fabrication, or common mode input voltage. The self-biasing scheme also contributes to the attenuation of common-mode input components. This attenuation allows HRC 300 to operate over a wide range of common-mode input voltages.

In accordance with one embodiment of the present invention, a complementary output, for example OUTN 306, may be included in the circuit. The negative feedback configuration described above may be applied to the complementary output node 311 as well.

Another advantage of comparator 300 is the reduced output swing. Output swing, also called output range, may be defined as the voltage difference between a high and low output. One way to set the output swing magnitude of comparator 300 is to change the size of devices 324A-327A with respect to devices 320A-323A, as well as the size of devices 324B-327B with respect to devices 320B-323B. For example, if the size of transistors 324A-327A and 324B-327B are decreased with respect to the size of transistors 320A-323A and 320B-323B the output swing can be increased.

Figure 4:
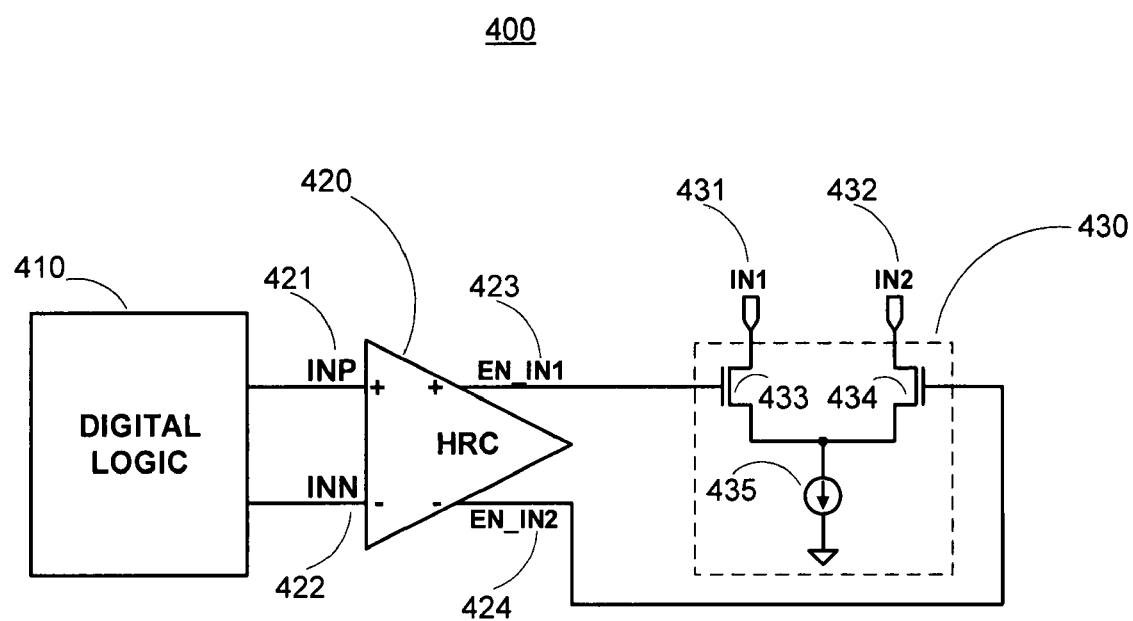
FIG. 4 is a system diagram illustrating a possible application of a comparator in accordance with one embodiment of the invention.

FIG. 4 shows an example of system 400 incorporating HRC 420 in accordance with one embodiment of the present invention. In system 400, digital logic 410 controls differential current switch 430 using HRC 420 as the digital-to-analog interface. HRC 420 accepts two inputs INP 421 and INN 422. Inputs INP 421 and INN 422 may be a pair of differential signals. Inputs 421 and 422 may be used to generate two analog outputs EN_IN1 423 and EN_IN2 424. Outputs 423 and 424 are coupled to differential current switch 430. Outputs EN_IN1 423 and EN_IN2 424 may be a pair of differential signals. If the voltage of EN_IN1 423 exceeds that of EN_IN2 424, transistor 433 will direct the current from current source 435 to input pin IN1 431. If the voltage of EN_IN2 424 exceeds that of EN_IN1 423, transistor 434 will direct the current from current source 435 to input pin IN2 432. Since the difference in current flow between the two transistors 433 and 434 increases proportionally to the square of the voltage difference between EN_IN1 423 and EN_IN2 424, a reduced output swing is sufficient for controlling current switch 430 in this system. Since a large output swing is a reduced priority, comparator speed may be increased in accordance with one embodiment of the present invention.

In the system shown in FIG. 4, HRC 420 operates using a 1.8V supply voltage. Digital logic 410 outputs either a 0V low signal or a 1.0V high signal, with a common-mode voltage level of 0.5V. This common-mode level is less than the supply voltage of HRC 420 so it is therefore within the acceptable range. In the system of FIG. 4, current switch 430 has a nominal operating point of 0.9V. In order to interface best with current switch 430, HRC 420 is designed to output a common-mode voltage level of 0.9V. In this configuration, HRC 420 has a switching level of only 0.2V. This switching level indicates that HRC 420 may output approximately 0.8V for a low output and 1.0V for a high output. The difference between these two output voltages (i.e., 0.2V) is significantly smaller than the difference between the input voltages of 0V and 1.0V (i.e., 1.0V). However, any difference in output voltages that is less than the difference in input voltages by at least 50% or more than 0.5 volts can be considered significantly smaller than the difference in input voltages.

Even though the output switching level described above (i.e., 0.2V) is less than rail-to-rail, it is sufficient for controlling a current switch. Therefore, by sacrificing the range of the output swing, a much faster comparator can be used in accordance with an embodiment of the present invention. While the embodiment shown in FIG. 4 shows a set of specific design parameters (e.g., supply voltage, common-mode output voltage), it should be noted that other design parameters can be used without deviating from the spirit of the present invention.

Referring now to FIGS. 5A-5G, various exemplary implementations of the present invention are shown.

Figure 5A:
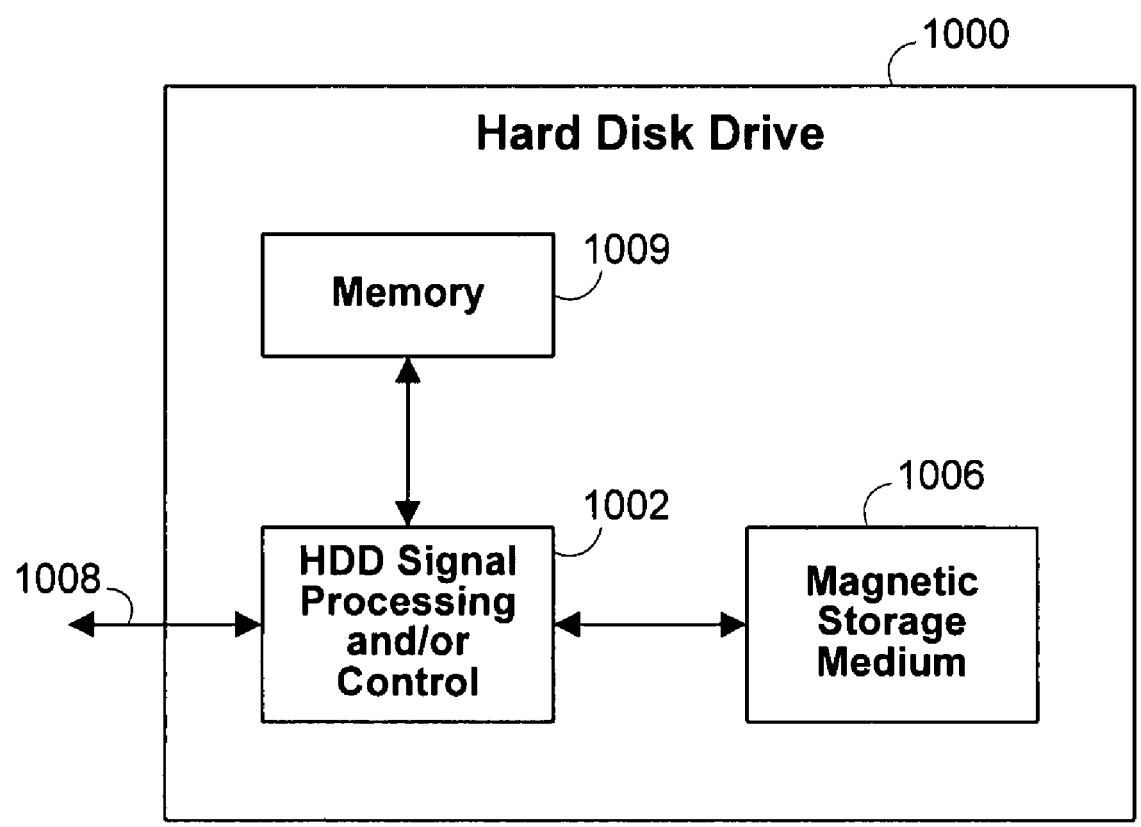
FIG. 5A is a block diagram of an exemplary hard disk drive that can employ the disclosed technology.

Referring now to FIG. 5A, the present invention can be implemented in a hard disk drive 1000. The present invention may implement either or both signal processing and/or control circuits, which are generally identified in FIG. 5A at 1002. In some implementations, the signal processing and/or control circuit 1002 and/or other circuits (not shown) in the HDD 1000 may process data, perform coding and/or encryption, perform calculations, and/or format data that is output to and/or received from a magnetic storage medium 1006.

The HDD 1000 may communicate with a host device (not shown) such as a computer, mobile computing devices such as personal digital assistants, cellular phones, media or MP3 players and the like, and/or other devices via one or more wired or wireless communication links 1008. The HDD 1000 may be connected to memory 1009 such as random access memory (RAM), low latency nonvolatile memory such as flash memory, read only memory (ROM) and/or other suitable electronic data storage.

Figure 5B:
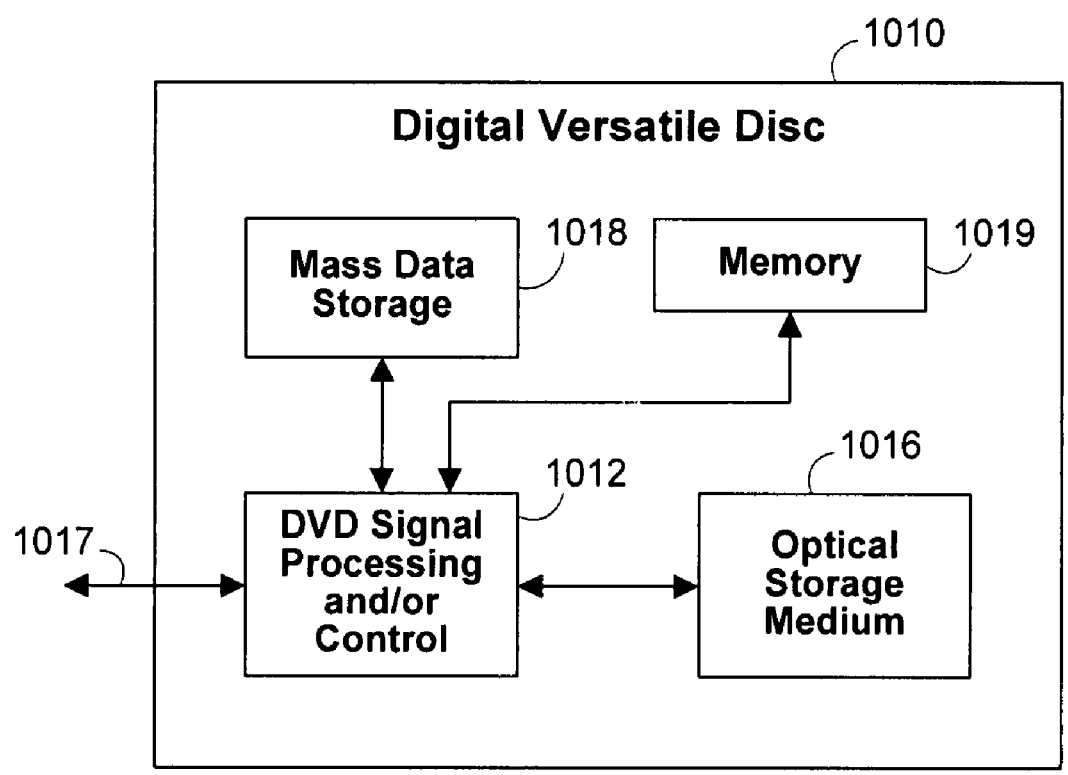
FIG. 5B is a block diagram of an exemplary digital versatile disc that can employ the disclosed technology.

Referring now to FIG. 5B, the present invention can be implemented in a digital versatile disc (DVD) drive 1010. The present invention may implement either or both signal processing and/or control circuits, which are generally identified in FIG. 5B at 1012, and/or mass data storage of the DVD drive 1010. The signal processing and/or control circuit 1012 and/or other circuits (not shown) in the DVD 1010 may process data, perform coding and/or encryption, perform calculations, and/or format data that is read from and/or data written to an optical storage medium 1016. In some implementations, the signal processing and/or control circuit 1012 and/or other circuits (not shown) in the DVD 1010 can also perform other functions such as encoding and/or decoding and/or any other signal processing functions associated with a DVD drive.

The DVD drive 1010 may communicate with an output device (not shown) such as a computer, television or other device via one or more wired or wireless communication links 1017. The DVD 1010 may communicate with mass data storage 1018 that stores data in a nonvolatile manner. The mass data storage 1018 may include a hard disk drive (HDD). The HDD may have the configuration shown in FIG. 5A. The HDD may be a mini HDD that includes one or more platters having a diameter that is smaller than approximately 1.8". The DVD 1010 may be connected to memory 1019 such as RAM, ROM, low latency nonvolatile memory such as flash memory and/or other suitable electronic data storage.

Figure 5C:
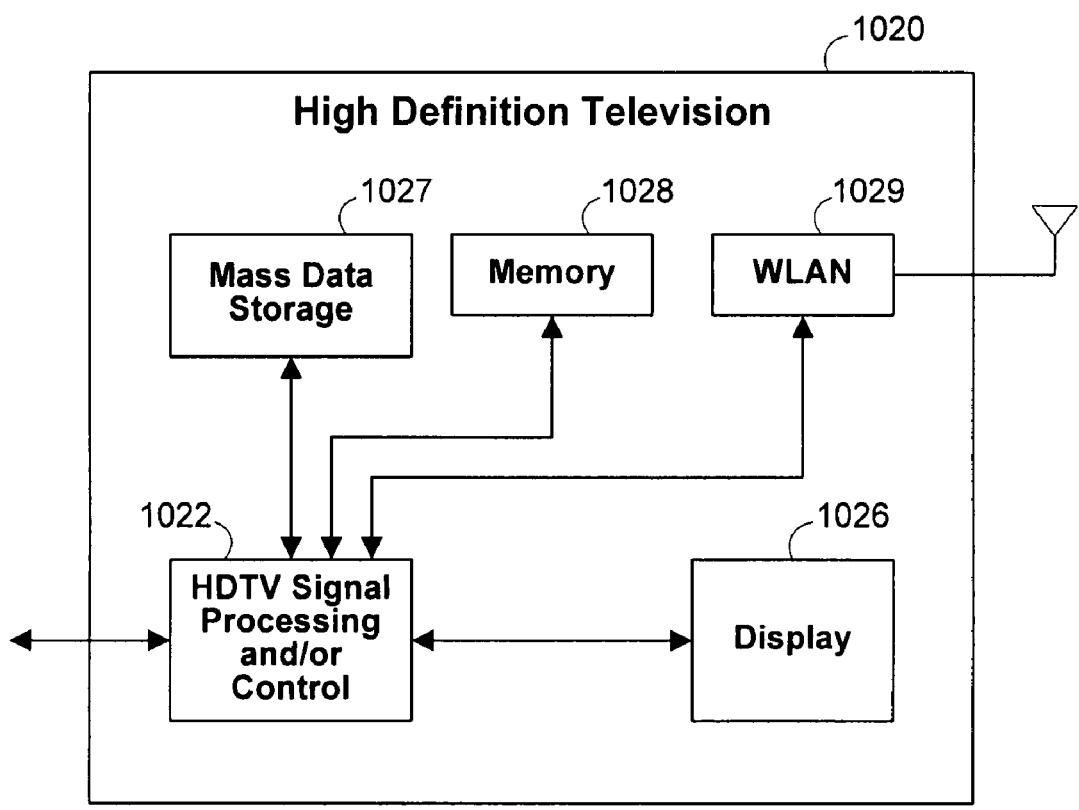
FIG. 5C is a block diagram of an exemplary high definition television that can employ the disclosed technology.

Referring now to FIG. 5C, the present invention can be implemented in a high definition television (HDTV) 1020. The present invention may implement either or both signal processing and/or control circuits, which are generally identified in FIG. 5C at 1022, a WLAN interface and/or mass data storage of the HDTV 1020. The HDTV 1020 receives HDTV input signals in either a wired or wireless format and generates HDTV output signals for a display 1026. In some implementations, signal processing circuit and/or control circuit 1022 and/or other circuits (not shown) of the HDTV 1020 may process data, perform coding and/or encryption, perform calculations, format data and/or perform any other type of HDTV processing that may be required.

The HDTV 1020 may communicate with mass data storage 1027 that stores data in a nonvolatile manner such as optical and/or magnetic storage devices for example hard disk drives HDD and/or DVDs. At least one HDD may have the configuration shown in FIG. 5A and/or at least one DVD may have the configuration shown in FIG. 5B. The HDD may be a mini HDD that includes one or more platters having a diameter that is smaller than approximately 1.8". The HDTV 1020 may be connected to memory 1028 such as RAM, ROM, low latency nonvolatile memory such as flash memory and/or other suitable electronic data storage. The HDTV 1020 also may support connections with a WLAN via a WLAN network interface 1029.

Figure 5D:
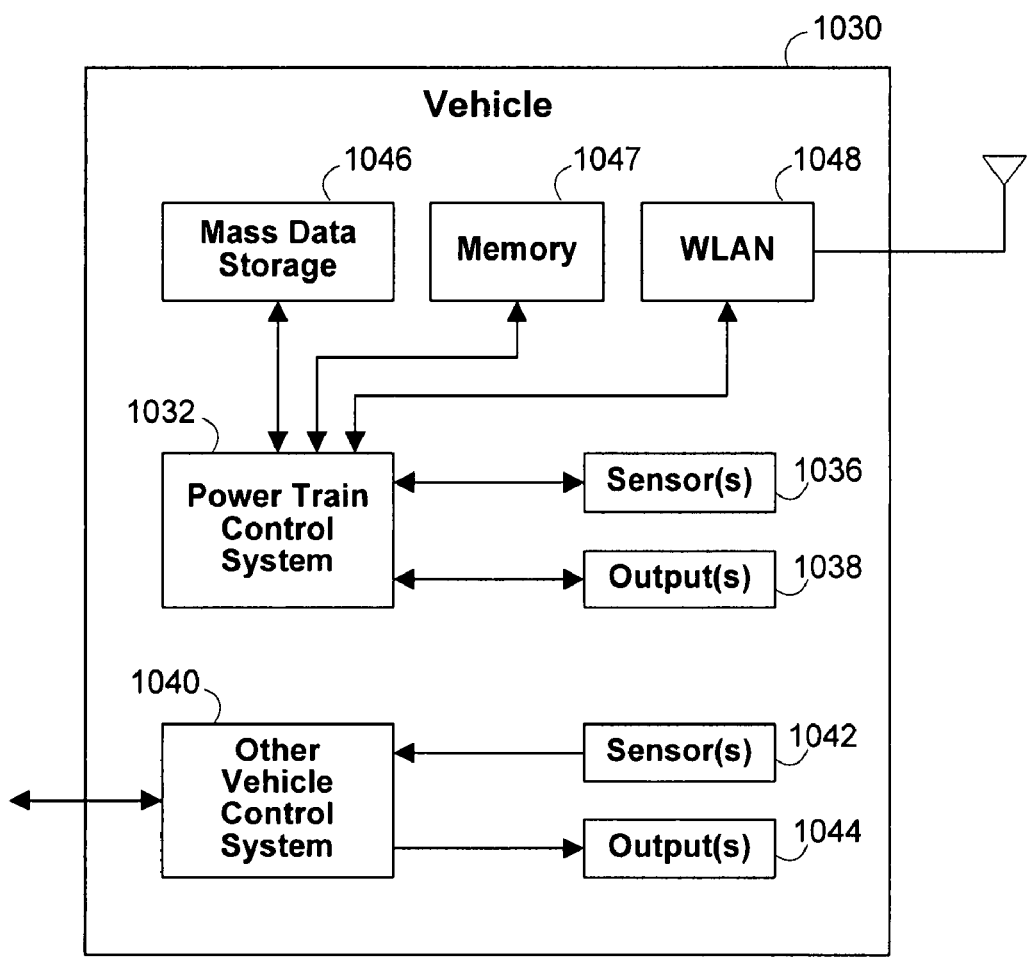
FIG. 5D is a block diagram of an exemplary vehicle that can employ the disclosed technology.

Referring now to FIG. 5D, the present invention implements a control system of a vehicle 1030, a WLAN interface and/or mass data storage of the vehicle control system. In some implementations, the present invention may implement a powertrain control system 1032 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 1040 of the vehicle 1030. The control system 1040 may likewise receive signals from input sensors 1042 and/or output control signals to one or more output devices 1044. In some implementations, the control system 1040 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 1032 may communicate with mass data storage 1046 that stores data in a nonvolatile manner. The mass data storage 1046 may include optical and/or magnetic storage devices for example hard disk drives HDD and/or DVDs. At least one HDD may have the configuration shown in FIG. 5A and/or at least one DVD may have the configuration shown in FIG. 5B. The HDD may be a mini HDD that includes one or more platters having a diameter that is smaller than approximately 1.8". The powertrain control system 1032 may be connected to memory 1047 such as RAM, ROM, low latency nonvolatile memory such as flash memory and/or other suitable electronic data storage. The powertrain control system 1032 also may support connections with a WLAN via a WLAN network interface 1048. The control system 1040 may also include mass data storage, memory and/or a WLAN interface (all not shown).

Figure 5E:
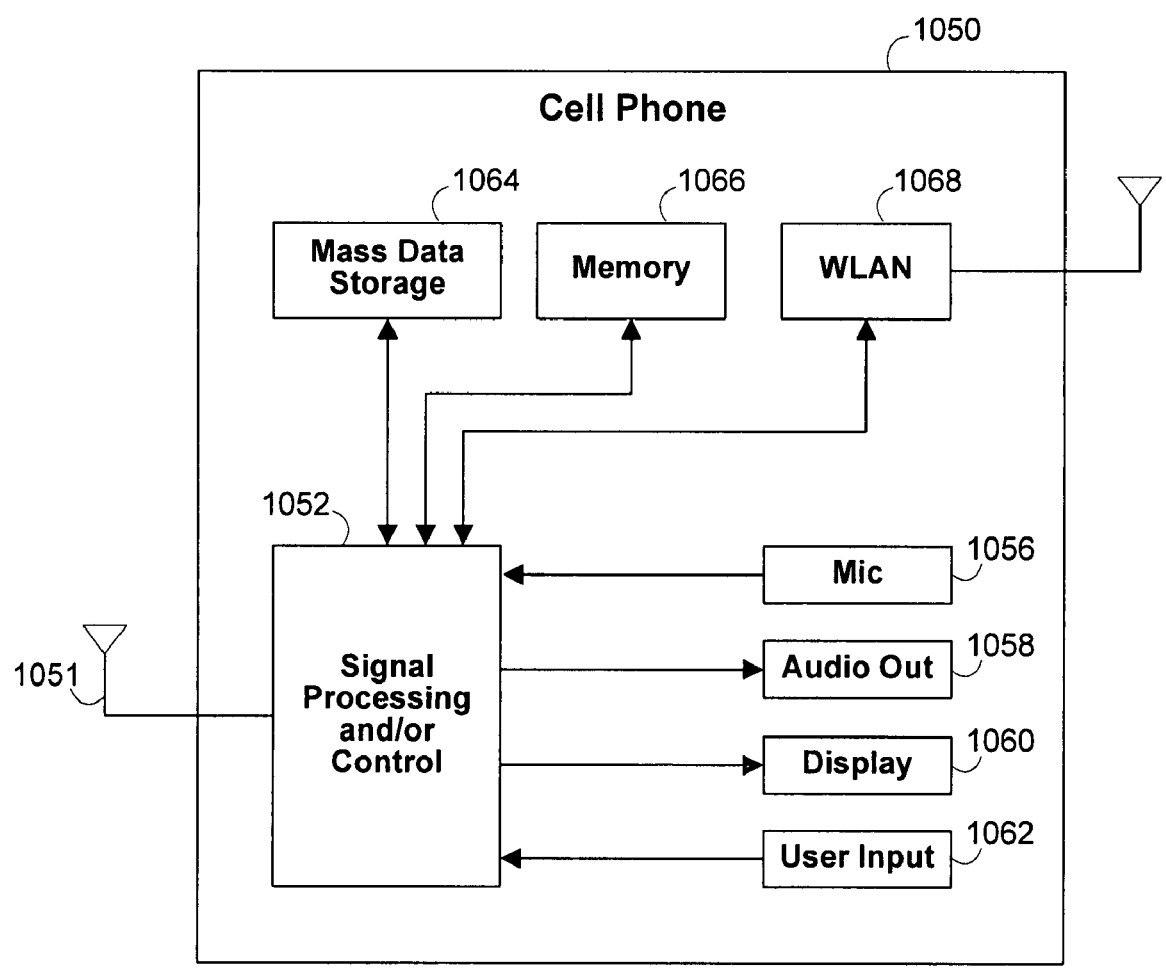
FIG. 5E is a block diagram of an exemplary cell phone that can employ the disclosed technology.

Referring now to FIG. 5E, the present invention can be implemented in a cellular phone 1050 that may include a cellular antenna 1051. The present invention may implement either or both signal processing and/or control circuits, which are generally identified in FIG. 5E at 1052, a WLAN interface and/or mass data storage of the cellular phone 1050. In some implementations, the cellular phone 1050 includes a microphone 1056, an audio output 1058 such as a speaker and/or audio output jack, a display 1060 and/or an input device 1062 such as a keypad, pointing device, voice actuation and/or other input device. The signal processing and/or control circuits 1052 and/or other circuits (not shown) in the cellular phone 1050 may process data, perform coding and/or encryption, perform calculations, format data and/or perform other cellular phone functions.

The cellular phone 1050 may communicate with mass data storage 1064 that stores data in a nonvolatile manner such as optical and/or magnetic storage devices for example hard disk drives HDD and/or DVDs. At least one HDD may have the configuration shown in FIG. 5A and/or at least one DVD may have the configuration shown in FIG. 5B. The HDD may be a mini HDD that includes one or more platters having a diameter that is smaller than approximately 1.8". The cellular phone 1050 may be connected to memory 1066 such as RAM, ROM, low latency nonvolatile memory such as flash memory and/or other suitable electronic data storage. The cellular phone 1050 also may support connections with a WLAN via a WLAN network interface 1068.

Figure 5F:
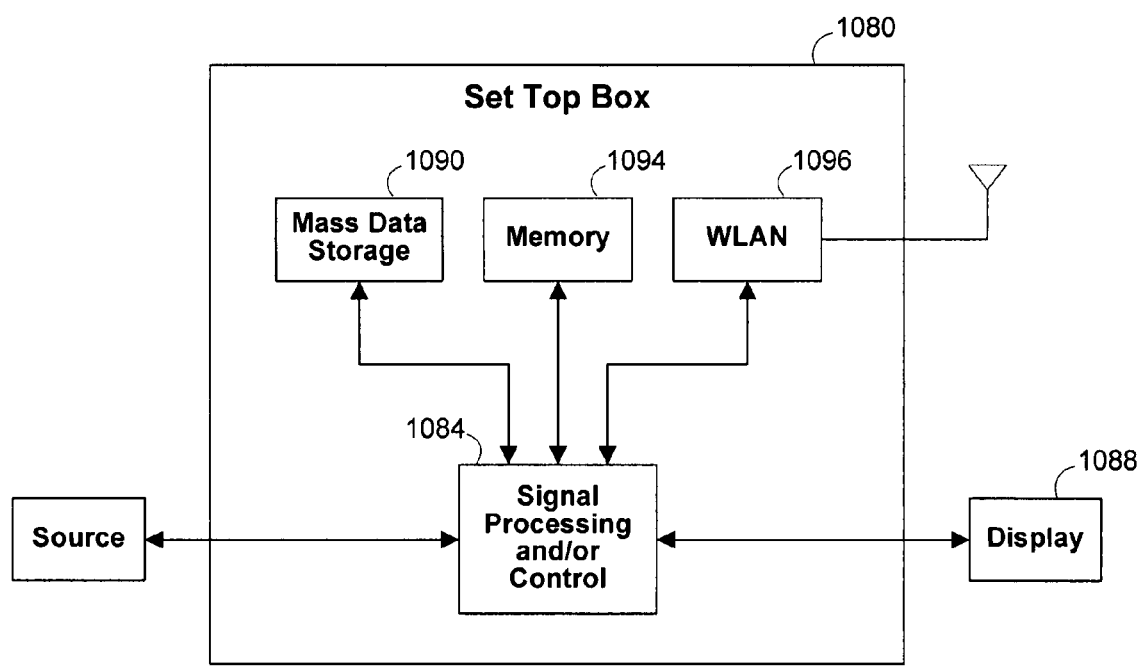
FIG. 5F is a block diagram of an exemplary set top box that can employ the disclosed technology.

Referring now to FIG. 5F, the present invention can be implemented in a set top box 1080. The present invention may implement either or both signal processing and/or control circuits, which are generally identified in FIG. 5F at 1084, a WLAN interface and/or mass data storage of the set top box 1080. The set top box 1080 receives signals from a source such as a broadband source and outputs standard and/or high definition audio/video signals suitable for a display 1088 such as a television and/or monitor and/or other video and/or audio output devices. The signal processing and/or control circuits 1084 and/or other circuits (not shown) of the set top box 1080 may process data, perform coding and/or encryption, perform calculations, format data and/or perform any other set top box function.

The set top box 1080 may communicate with mass data storage 1090 that stores data in a nonvolatile manner. The mass data storage 1090 may include optical and/or magnetic storage devices for example hard disk drives HDD and/or DVDs. At least one HDD may have the configuration shown in FIG. 5A and/or at least one DVD may have the configuration shown in FIG. 5B. The HDD may be a mini HDD that includes one or more platters having a diameter that is smaller than approximately 1.8". The set top box 1080 may be connected to memory 1094 such as RAM, ROM, low latency nonvolatile memory such as flash memory and/or other suitable electronic data storage. The set top box 1080 also may support connections with a WLAN via a WLAN network interface 1096.

Figure 5G:
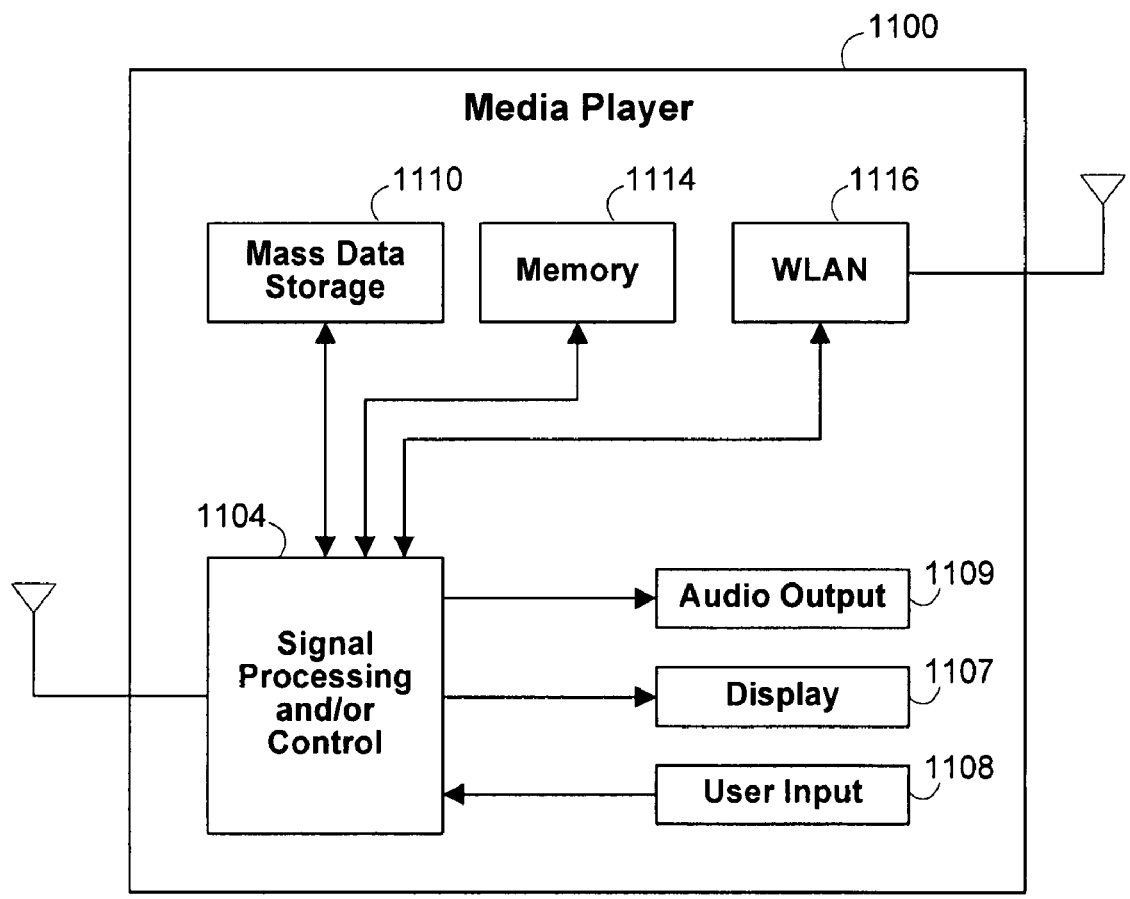
FIG. 5G is a block diagram of an exemplary media player that can employ the disclosed technology.

Referring now to FIG. 5G, the present invention can be implemented in a media player 1100. The present invention may implement either or both signal processing and/or control circuits, which are generally identified in FIG. 5G at 1104, a WLAN interface and/or mass data storage of the media player 1100. In some implementations, the media player 1100 includes a display 1107 and/or a user input 1108 such as a keypad, touchpad and the like. In some implementations, the media player 1100 may employ a graphical user interface (GUI) that typically employs menus, drop down menus, icons and/or a point-and-click interface via the display 1107 and/or user input 1108. The media player 1100 further includes an audio output 1109 such as a speaker and/or audio output jack. The signal processing and/or control circuits 1104 and/or other circuits (not shown) of the media player 1100 may process data, perform coding and/or encryption, perform calculations, format data and/or perform any other media player function.

The media player 1100 may communicate with mass data storage 1110 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 5A and/or at least one DVD may have the configuration shown in FIG. 5B. The HDD may be a mini HDD that includes one or more platters having a diameter that is smaller than approximately 1.8". The media player 1100 may be connected to memory 1114 such as RAM, ROM, low latency nonvolatile memory such as flash memory and/or other suitable electronic data storage. The media player 1100 also may support connections with a WLAN via a WLAN network interface 1116. Still other implementations in addition to those described above are contemplated.

Thus it is seen that circuitry for a high-speed reduced-output-swing self-biased fully-complementary CMOS comparator with rail-to-rail input common-mode range is provided. One skilled in the art will appreciate that the invention may be practiced by other than the described embodiments, which are presented for purposes of illustration and not of limitation, and the present invention is limited only by the claims which follow.

What is claimed is:

1. A digital to analog interface comprising:
    input circuitry operable to receive digital input signals and to generate digital output signals;
    comparator circuitry operable to receive said digital output signals from said input circuitry and to generate reduced range output signals, wherein said reduced range output signals have a maximum voltage difference that is significantly smaller than a maximum voltage difference between said digital output signals of said input circuitry; and
    output circuitry operable to receive said reduced range output signals from said comparator circuitry and to generate analog output signals.

2. The interface of claim 1 wherein said maximum voltage difference between said reduced range output signals is at least 50% less than said maximum voltage difference between said digital output signals of said input circuitry.

3. The interface of claim 2 wherein said maximum voltage difference between said reduced range output signals is approximately 80% less than said maximum voltage difference between said digital output signals of said input circuitry.

4. The interface of claim 3 wherein said maximum voltage difference between said reduced range output signals is approximately 0.2V and said maximum voltage difference between said digital output signals of said input circuitry is approximately 1.0V.

5. The interface of claim 1 wherein said output circuitry comprises a current switch.

6. The interface of claim 1 wherein said comparator circuitry comprises a supply voltage and wherein said digital output signals of said input circuitry have a common-mode voltage level that is less than said supply voltage of said comparator circuitry.

7. The interface of claim 1 wherein said comparator circuitry comprises a supply voltage and wherein said reduced range output signals of said comparator circuitry have a common-mode voltage level that is approximately half of said supply voltage of said comparator circuitry.

8. The interface of claim 1 wherein said reduced range output signals of said comparator circuitry vary by approximately 0.2V or less.

9. The interface of claim 1 wherein said comparator circuitry comprises:
    a first, second, third, and fourth transistors coupled in series between a first voltage and a second voltage and having their gates coupled both together and to a junction of said second and third transistors;
    a fifth, sixth, seventh, and eighth transistors coupled in series between said first voltage and said second voltage and having their gates coupled both together and to a junction of said sixth and seventh transistors;
    a ninth and tenth transistors coupled between said first voltage and a first node;
    an eleventh and twelfth transistors coupled between a second node and said second voltage, wherein said ninth and eleventh transistors have their gates coupled together to the gates of said first, second, third and fourth transistors and said tenth and twelfth transistors have their gates coupled together to the gates of said fifth, sixth, seventh, and eighth transistors;
    a thirteenth transistor coupled between said first node and a junction of said third and fourth transistors;
    a fourteenth transistor coupled between said second node and a junction of said first and second transistors, wherein said thirteenth and fourteenth transistors have their gates coupled together to receive a first of said digital output signals;
    a fifteenth transistor coupled between said first node and a junction of said seventh and eighth transistors; and
    a sixteenth transistor coupled between said second node and a junction of said fifth and sixth transistors, wherein said fifteenth and sixteenth transistors have their gates coupled together to receive a second of said digital output signals.

10. The interface of claim 9 wherein a first of said reduced range output signals is coupled to the gates of said first, second, third, fourth, ninth, and eleventh transistors, and a second of said reduced range output signals is coupled to the gates of said fifth, sixth, seventh, eighth, tenth, and twelfth transistors.

11. The interface of claim 9 wherein said first and fourth transistors are a complementary pair, said second and third transistors are a complementary pair, said fifth and eighth transistors are a complementary pair, said sixth and seventh transistors are a complementary pair, said ninth and eleventh transistors are a complementary pair, said tenth and twelfth transistors are a complementary pair, said thirteenth and fourteenth transistors are a complementary pair, and said fifteenth and sixteenth transistors are a complementary pair.

12. The interface of claim 9 wherein said first, second, fifth, sixth, ninth, tenth, thirteenth, and fifteenth transistors are p-type metal-oxide semiconductor field-effect transistors (MOSFETs); and said third, fourth, seventh, eighth, eleventh, twelfth, fourteenth, and sixteenth transistors are n-type metal-oxide semiconductor field-effect transistors (MOSFETs).

13. A digital to analog interface comprising:
    input means operable to receive digital input signals and to generate digital output signals;
    comparator means for receiving said digital output signals from said input means and generating reduced range output signals, wherein said reduced range output signals have a maximum voltage difference that is significantly smaller than a maximum voltage difference between said digital output signals of said input means; and
    output means for receiving said reduced range output signals from said comparator means and for generating analog output signals.

14. The interface of claim 13 wherein said maximum voltage difference between said reduced range output signals is at least 50% less than said maximum voltage difference between said digital output signals of said input means.

15. The interface of claim 14 wherein said maximum voltage difference between said reduced range output signals is approximately 80% less than said maximum voltage difference between said digital output signals of said input means.

16. The interface of claim 13 wherein said maximum voltage difference between said reduced range output signals is approximately 0.2V and said maximum voltage difference between said digital output signals of said input means is approximately 1.0V.

17. The interface of claim 13 wherein said output means comprises a current switch.

18. The interface of claim 13 wherein said comparator means comprises a supply voltage and wherein said digital output signals of said input means have a common-mode voltage level that is less than said supply voltage of said comparator means.

19. The interface of claim 13 wherein said comparator means comprises a supply voltage and wherein said reduced range output signals of said comparator means have a common-mode voltage level that is approximately half of said supply voltage of said comparator means.

20. The interface of claim 13 wherein said reduced range output signals of said comparator means vary by approximately 0.2V or less.

21. A method for interfacing digital input circuitry with analog output circuitry using a comparator, the method comprising:
   generating two digital signals using said digital input circuitry;
   comparing relative voltages of said digital signals using said comparator;
   generating reduced range analog signals using said comparator, wherein said reduced range analog signals have a maximum voltage difference that is significantly smaller than a maximum voltage difference between said digital signals; and
   controlling said analog output circuitry with said reduced range analog signals.

22. The method of claim 21 wherein said maximum voltage difference between said reduced range analog signals is at least 50% less than said maximum voltage difference between said digital signals.

23. The method of claim 22 wherein said maximum voltage difference between said reduced range analog signals is approximately 80% less than said maximum voltage difference between said digital signals.

24. The method of claim 22 wherein said maximum voltage difference between said reduced range analog signals is approximately 0.2V and said maximum voltage difference between said digital signals is approximately 1.0V.

25. The method of claim 21 wherein said analog output circuitry comprises a current switch.

26. The method of claim 21 wherein said comparator comprises a supply voltage and wherein said digital signals have a common-mode voltage level that is less than said supply voltage of said comparator.

27. The method of claim 21 wherein said comparator comprises a supply voltage and wherein said reduced range analog signals have a common-mode voltage level that is approximately half of said supply voltage of said comparator.

28. The method of claim 21 wherein said reduced range analog signals vary by approximately 0.2V or less.

* * * * *